United States Patent
Toda

(10) Patent No.: US 9,135,991 B2
(45) Date of Patent: *Sep. 15, 2015

(54) SEMICONDUCTOR MEMORY DEVICE

(71) Applicant: Kabushiki Kaisha Toshiba, Minato-ku (JP)

(72) Inventor: Haruki Toda, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/149,489

(22) Filed: Jan. 7, 2014

(65) Prior Publication Data

US 2014/0119098 A1 May 1, 2014

Related U.S. Application Data

(63) Continuation of application No. 13/586,170, filed on Aug. 15, 2012, now Pat. No. 8,665,632.

(30) Foreign Application Priority Data

Dec. 28, 2011 (JP) .................................. 2011-289173

(51) Int. Cl.
G11C 11/00 (2006.01)
G11C 13/00 (2006.01)

(52) U.S. Cl.
CPC ........ *G11C 13/0002* (2013.01); *G11C 13/0011* (2013.01); *G11C 13/0069* (2013.01); G11C2013/0073 (2013.01); *G11C 2213/15* (2013.01); *G11C 2213/71* (2013.01); *G11C 2213/77* (2013.01)

(58) Field of Classification Search
CPC ........... G11C 13/0011; G11C 13/0069; G11C 13/0002; G11C 11/4076; G11C 7/1045; G11C 7/22

USPC ............... 365/148, 189.09, 175, 51, 100, 163
See application file for complete search history.

(56) References Cited

U.S. PATENT DOCUMENTS 5,781,495 A * 7/1998 Arimoto .................. 365/230.03
7,952,909 B2 5/2011 Inoue et al.
(Continued)

FOREIGN PATENT DOCUMENTS

| JP | 2002-537627 A | 11/2002 |
|---|---|---|
| JP | 2010-33675 | 2/2010 |
| WO | WO 2008/012871 A1 | 1/2008 |

OTHER PUBLICATIONS

Office Action issued Jun. 17, 2014, in Japanese Patent Application No. 2011-289173 with English translation.

*Primary Examiner* — Gene Auduong
(74) *Attorney, Agent, or Firm* — Oblon, McClelland, Maier & Neustadt, L.L.P.

(57) ABSTRACT

A semiconductor memory device according to the embodiment comprises memory cells each having asymmetrical voltage-current characteristics, wherein the memory cell has a first state, and a second state and a third state of higher resistances than that in the first state, wherein the memory cell, (1) in the second state, makes a transition to the first state on application of a first voltage of the first polarity, (2) in the first state, makes a transition to the second state on application of a second voltage of the second polarity, (3) in the first state, makes a transition to the third state on application of a third voltage of the second polarity (the third voltage<the second voltage), and (4) in the third state, makes a transition to the first state on application of a fourth voltage of the first polarity (the fourth voltage<the first voltage).

7 Claims, 15 Drawing Sheets

(56) References Cited

U.S. PATENT DOCUMENTS

| | | | |
|---|---|---|---|
| 8,045,416 B2 * | 10/2011 | Walker | 365/238.5 |
| 8,094,477 B2 | 1/2012 | Maejima | |
| 8,441,839 B2 | 5/2013 | Azuma et al. | |
| 8,665,632 B2 * | 3/2014 | Toda | 365/148 |
| 2010/0027308 A1 | 2/2010 | Maejima | |

* cited by examiner

SEMICONDUCTOR MEMORY DEVICE

CROSS-REFERENCE TO RELATED APPLICATIONS

This application is Continuation of U.S. application Ser. No. 13/586,170 filed Aug. 15, 2012, which is based upon and claims the benefit of priority from the prior Japanese Patent Application No. 2011-289173, filed on Dec. 28, 2011, the entire contents of which are incorporated herein by reference.

FIELD

The embodiment relates to a semiconductor memory device.

BACKGROUND

As semiconductor memory devices capable of storing mass data for use, variable resistance memories (ReRAM: Resistive RAM) and so forth, which can be easily formed in three dimensions, have received attention. These variable resistance memories are characterized in the asymmetry of the voltage-current characteristic that greatly changes in accordance with the direction of the voltage applied to a memory cell.

These memory cells include one that exhibits asymmetrical voltage-current characteristics depending on the history of applied voltages on the memory cell.

The operation of making access to the conventional memory cells, however, cannot be applied as it is to a semiconductor memory device that uses memory cells having such the characteristics that depend on the history of applied voltages.

DETAILED DESCRIPTION

A semiconductor memory device according to the embodiment comprises a memory cell array including a memory cell layer, the memory cell layer containing plural first lines, plural second lines intersecting the first lines, and plural memory cells provided at the intersections of the plural first lines and second lines, wherein the memory cell has asymmetrical voltage-current characteristics on application of a voltage of a first polarity and on application of a voltage of a second polarity different from the first polarity, wherein the memory cell has a first state, and a second state and a third state of higher resistances than that in the first state, wherein the memory cell, (1) in the second state, makes a transition to the first state on application of a first voltage of the first polarity, (2) in the first state, makes a transition to the second state on application of a second voltage of the second polarity, (3) in the first state, makes a transition to the third state on application of a third voltage of the second polarity (the third voltage<the second voltage), and (4) in the third state, makes a transition to the first state on application of a fourth voltage of the first polarity (the fourth voltage<the first voltage).

A semiconductor memory device according to the embodiment will now be described below with reference to the drawings.

[Configuration of Semiconductor Memory Device]
<General Configuration>

First, a description is given to a general configuration of the semiconductor memory device according to the embodiment.

Figure 1:
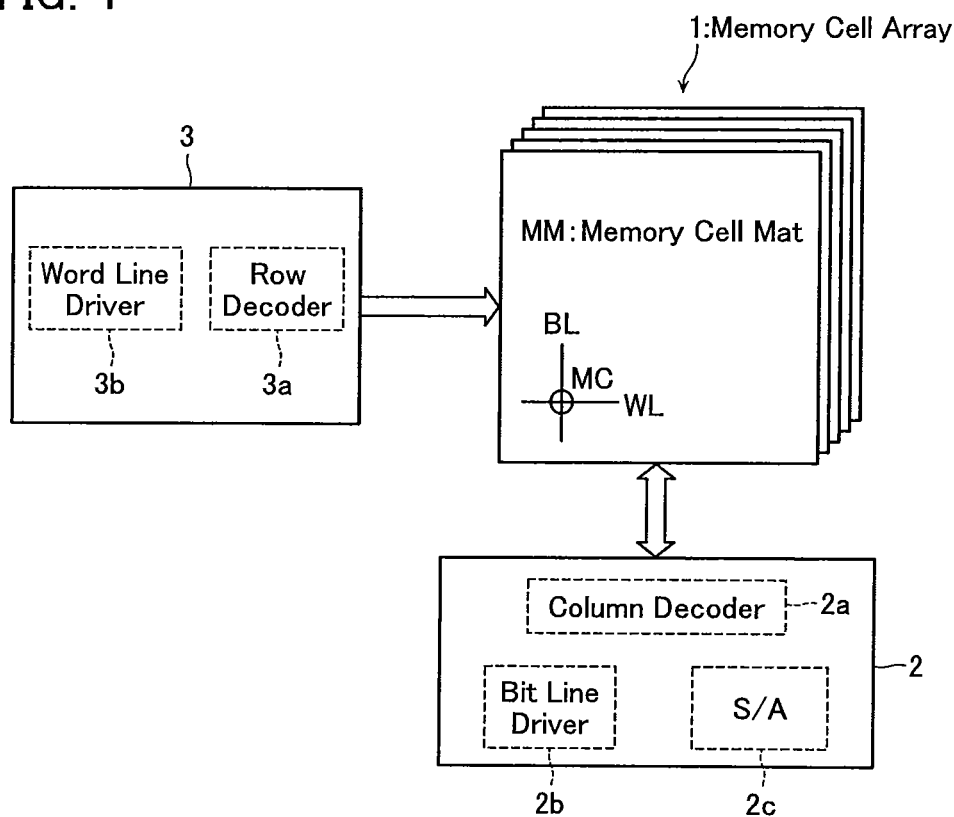
FIG. 1 is a block diagram of a semiconductor memory device according to the embodiment.

FIG. 1 is a block diagram of the semiconductor memory device according to the embodiment. This semiconductor memory device comprises a memory cell array 1. The memory cell array 1 includes plural stacked memory cell mats MM (memory cell layers). Each memory cell mat MM includes plural bit lines BL (first lines) and plural word lines WL (second lines), and memory cells MC, which can be selected by these word lines WL and bit lines BL.

The bit lines BL in the memory cell mat MM are electrically connected to a column control circuit 2, which controls the bit lines BL for erasing data in the memory cell MC, writing data into the memory cell MC and reading data out of the memory cell MC. Hereinafter, erasing data in the memory cell MC and writing data into the memory cell MC are collectively referred to as "write operation", and reading data out of the memory cell MC as "read operation". In addition, write and read operations are collectively referred to as "access operation". The column control circuit 2 includes a column decoder 2a operative to select a bit line BL, a bit line driver 2b operative to establish a voltage required for access operation on the bit line BL, and a sense amplifier unit 2c operative to detect and amplify the current flowing in the memory cell MC to determine the data stored in the memory cell MC.

On the other hand, the word lines WL in the memory cell mat MM are electrically connected to a row control circuit 3, which selects a word line WL at the time of access operation. The row control circuit 3 includes a row decoder 3a operative to select a word line WL, and a word line driver 3b operative to establish a voltage required for access operation on the word line WL. Together with the column control circuit 2, the row control circuit 3 is contained in an access circuit.

<Memory Cell>

Next, a description is given to state changes of a memory element used in the memory cell MC.

Figure 2:
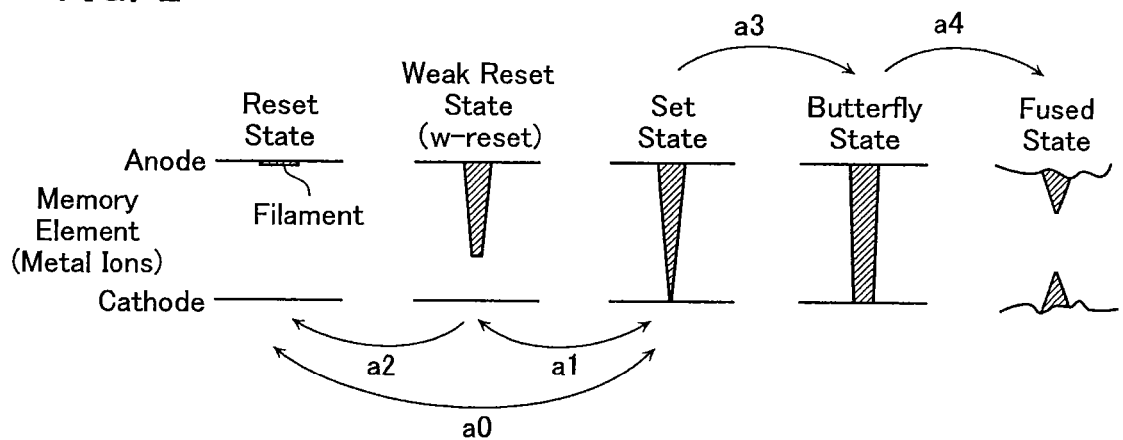
FIG. 2 is a diagram showing the situation of state changes caused by voltages applied to a memory element in the semiconductor memory device according to the embodiment.

FIG. 2 is a diagram illustrative of state changes caused by voltages applied to the memory element according to the embodiment.

Memory elements of the variable resistance type include an ion memory that utilizes the filament formation of silver ions and so forth. This memory element shows asymmetrical resistances in accordance with the direction of the applied voltage. The mechanism is roughly as shown in FIG. 2. Hereinafter, in the page, the upper side of the memory element is referred to as an "anode" (first electrode), and the lower side as a "cathode" (second electrode). In addition, of biases placed across the memory element, the bias defined when the voltage on the cathode is lower than that on the anode is referred to as "forward bias" (a voltage of a first polarity), and the bias defined when the voltage on the cathode is higher than that on the anode is referred to as "reverse bias" (a voltage of a second polarity).

The memory element has five states in accordance with the states of a filament formed in metal ions, including a reset state (second state), a weak reset state (third state, also referred to as "w-reset"), a set state (first state), a butterfly state (fourth state), and a fused state.

It can be considered that metal ions flowing out of the anode and grow. A state in which the position of the core of growth stabilizes is the reset state. In the reset state, the memory element has a higher resistance. It may be considered additionally that the filament formation can be achieved by metal ions precipitating on the cathode and growing in the direction opposite to that in FIG. 2. In either case, the situation of a contact between the filament and the electrode is identical.

When the memory element in the reset state is forward-biased with a voltage equal to or higher than a set voltage Vset (first voltage), the precipitation of metal ions grows rapidly such that the anode is connected to the cathode in the memory element through a filament (a0 in the figure). This state is the set state. In the set state, the memory element has a lower resistance.

When the memory element in the set state is biased, the memory element is given a history of applied voltages in accordance with the direction of the bias and the length of retention time.

For the use of metal ions as a memory element, the memory element is reverse-biased to isolate the filament from the cathode (a1 in the figure). This state is the weak reset state. In the weak reset state, the memory element has a higher resistance.

When the memory element in the weak reset state is reverse-biased with a voltage equal to or higher than a much higher reset voltage Vreset (second voltage), the filament disappears such that the memory element returns to the reset state (a2 in the figure). When the memory element in the weak reset state is forward-biased, on the other hand, the memory element easily makes a transition to the set state even if the bias is small (a1 in the figure). In a word, forward-biasing the memory element small to find the variation in resistance of the memory element at that time makes it possible to determine if the memory element is in the weak reset state or not. If the memory element is in the reset state, the formation of a filament cannot proceed even when forward-biasing the memory element small. Therefore, the memory element still has the higher resistance unchanged.

Further forward-biasing the memory element in the set state continuously makes the filament grow and completely connect to the cathode (a3 in the figure). In this case, it is not possible to reverse-bias the memory element. Therefore, it is not possible to return the memory element to the weak reset state or the reset state. This state is the butterfly state. The "butterfly" is so called because the shape of the graph of the voltage-current characteristic of the memory element looks like the shape of butterfly wings.

Once the memory element enters into the butterfly state, the voltage-current characteristic of the memory element loses non-linearity. Therefore, the memory element cannot be utilized as a rewritable memory cell MC. The memory element in the butterfly state is in a state in which the anode and the cathode establish a short circuit. Accordingly, it is not preferable for executing access operation by the later-described floating access method. Therefore, when a memory element in the butterfly state arises, a flow of current is supplied into the memory cell to fuse the filament (a4 in the figure). This state is the fused state. The memory element in the fused state is in a state in which the anode and the cathode make an open circuit permanently, which is a high-resistance state. Accordingly, it cannot be utilized as a rewritable memory cell MC. Once the filament is fused, however, it is prevented from exerting bad influences on other memory cells MC.

In the embodiment, when the above memory element is utilized as a nonvolatile memory cell MC, the reset state is associated with data '1' and the weak reset state with data '0' to store data. The set state appears on changing the memory cell to the weak reset or on determining if the memory cell is in the weak reset state.

Next, a description is given to a voltage-current characteristic of a memory cell MC when the above-described memory element is used as the memory cell MC.

Figure 3A:
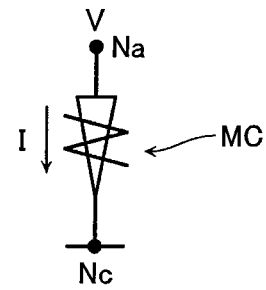
FIG. 3A is a diagram showing a circuit symbol of a memory cell in the semiconductor memory device according to the embodiment.

FIG. 3A is a diagram showing a circuit symbol of the memory cell MC according to the embodiment. A node Na in the figure represents the anode, and a node Nc represents the cathode.

Figure 3B:
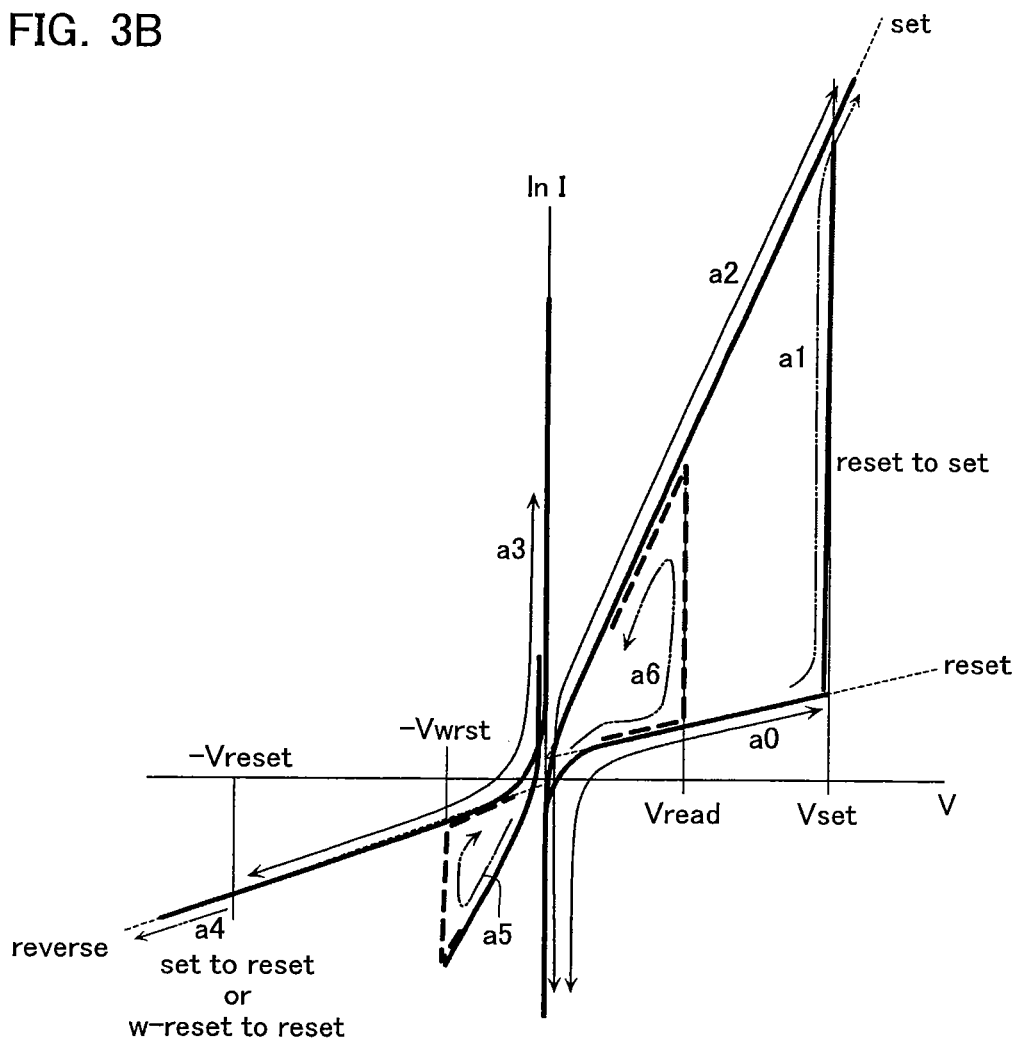
FIG. 3B is a diagram showing a voltage-current characteristic of the memory cell in the semiconductor memory device according to the embodiment.

FIG. 3B is a diagram showing a voltage-current characteristic of the memory cell MC according to the embodiment. A graph in the figure is shown by taking voltages V applied to the memory cell MC along the horizontal axis and logarithmic values I of cell current flowing in the memory cell MC along the vertical axis.

At the start, a description is given to the voltage-current characteristic of the memory cell MC on making transitions between the set state and the reset state.

The memory cell MC has a property of making the voltage-current characteristic asymmetrical in accordance with the direction of bias as shown in FIG. 3B. As for the voltage-current characteristic of the memory cell MC, the cell current can be approximated as in I~A exp(αV) (A, α are constants) except the vicinity of an applied voltage V=0. The coefficients α have almost the same extent when the memory cell in the reset state is forward-biased, when the memory cell in the reset state is reverse-biased and when the memory cell in the set state is reverse-biased. In contrast, the coefficient α becomes particularly large when the memory cell in the set state is forward-biased. In the vicinity of the applied voltage V=0, ln I exhibits ±∞.

When the memory cell MC in the reset state is forward-biased, the memory cell MC still remains in the reset state within a range of applied voltages V of from near 0 V to the set voltage Vset. In this case, the cell current I flowing in the memory cell MC changes reversibly in accordance with variations in the applied voltage V (a0 in the figure). When the applied voltage V rises up to the set voltage Vset or higher, the state of the memory cell MC changes from the reset state to the set state irreversibly (set operation) (a1 in the figure).

When the memory cell MC in the set state is forward-biased, on the other hand, the cell current I flowing in the memory cell MC changes reversibly in accordance with variations in the applied voltage V (a2 in the figure). The memory cell MC in the set state, however, makes no transition to the reset state so long as it is forward-biased even if the applied voltage V is elevated.

When the memory cell MC in the reset state is reverse-biased, the cell current I flowing in the memory cell MC changes reversibly in accordance with variations in the applied voltage V (a3 in the figure). The memory cell MC in the reset state, however, makes no transition to the set state so long as it is reverse-biased even if the applied voltage V is elevated.

When the memory cell MC in the set state is reverse-biased, on the other hand, the memory cell MC still remains in the set state within a range of from the applied voltage V to a voltage −Vreset. In this case, the cell current I flowing in the memory cell MC changes reversibly in accordance with variations in the applied voltage V (a3 in the figure). When the applied voltage V falls down to the voltage −Vreset or lower, the state of the memory cell MC changes from the set state to the reset state irreversibly (reset operation).

Subsequently, a description is given to the voltage-current characteristic of the memory cell MC on making transitions between the weak reset state and the reset state. The state change from the weak reset state and the state change to the weak reset state (weak reset operation) are shown with thick dotted-lines in FIG. 3B.

The memory cell MC retains the reset state so long as a voltage V equal to or lower than the voltage −Vreset is applied (a4 in the figure). This characteristic can be maintained reversibly over the applied voltage V until a voltage V generally equal to or higher than the set voltage Vset is applied.

The memory cell MC makes a transition to the set state when a voltage V equal to or higher than the set voltage Vset is applied. In this case, the set state can be maintained so long as a considerably higher voltage than the set voltage Vset is not applied to the memory cell MC or the set voltage Vset is not applied to the memory cell MC for a long time.

When the memory cell MC in the set state is applied with a voltage −Vwrst near 0 V (hereinafter Vwrst is referred to as a "weak reset voltage" (third voltage)), the memory cell MC gradually makes a transition from the set state to the weak reset state (a5 in the figure). The voltage-current characteristic of the memory cell MC in the weak reset state is analogous to that in the reset state. The memory cell MC in the weak reset state, however, can make a transition to the set state (a6 in the figure) only with the application of a read voltage Vread (fourth voltage) smaller than the set voltage, different from the memory cell MC in the reset state. The variation in voltage within a range between the voltage −Vwrst and the read voltage Vread is not possible to define the state of the memory cell MC as either the set state or the reset state due to the history of applied voltages. Therefore, determining if the memory cell MC is in the weak reset state requires monitoring the variation in resistance of the memory cell MC with the application of a voltage V slightly exceeding the range of from the voltage −Vwrst to the read voltage Vread.

The embodiment utilizes the characteristic of the history of applied voltages on a memory cell MC, which makes no transition to the weak reset state not via the above-described set state and makes a transition to the reset state from any state, thereby storing data in that memory cell MC.

If a considerably higher voltage than the set voltage Vset is applied to the memory cell MC or the set voltage Vset is applied to the memory cell MC continuously for a long time, the memory cell MC enters into the butterfly state. In this case, the memory cell MC cannot work as a reversible memory cell and can be regarded as a current fuse formed of a metal filament.

<Memory Cell Array>

Next, a description is given to a structure of a memory cell array 1 including the above-described memory cells MC.

Figure 4:
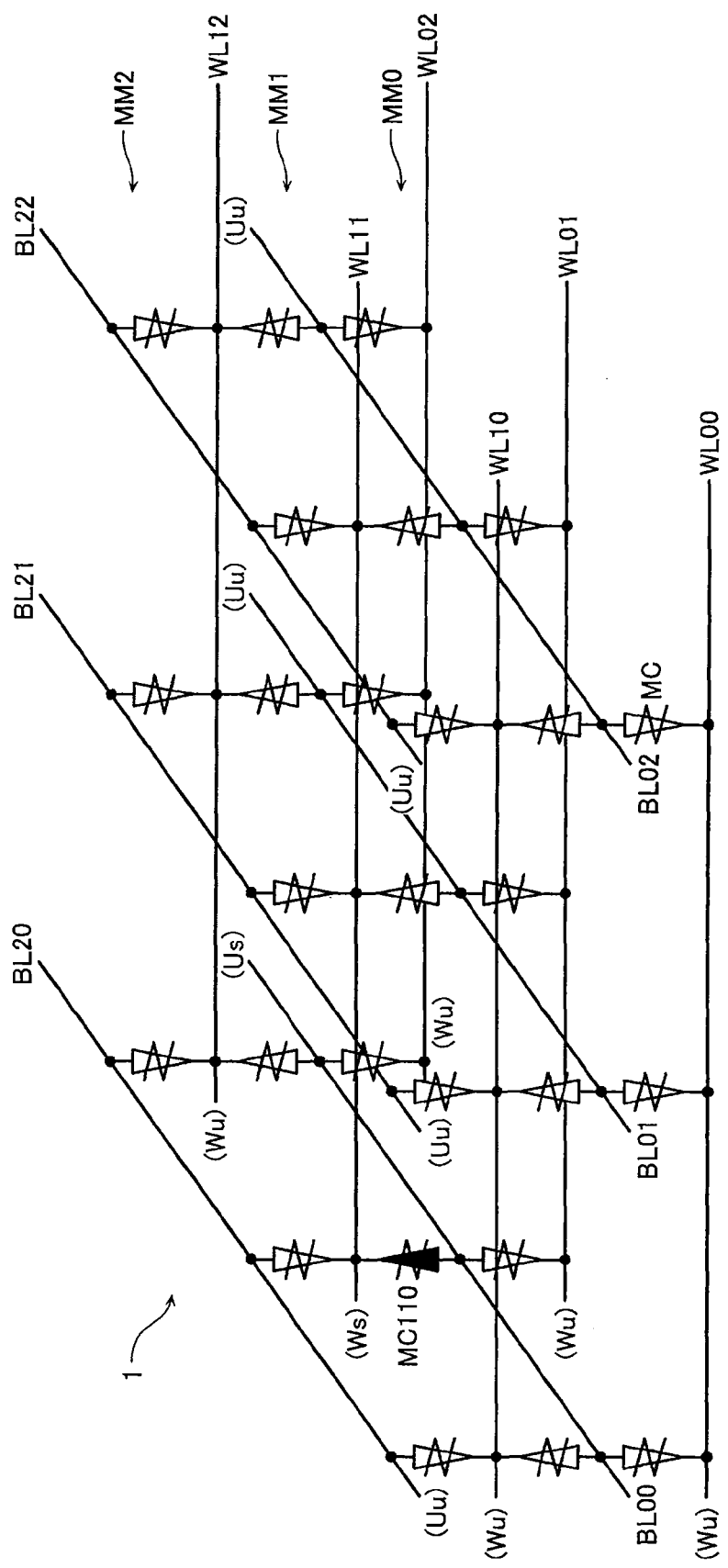
FIG. 4 is a diagram showing a structure of a memory cell array in the semiconductor memory device according to the embodiment.

FIG. 4 is a diagram showing the structure of the memory cell array 1 according to the embodiment.

The memory cell array 1 has a stacked structure of plural memory cell mats MM.

Each memory cell mat MM includes plural word lines WL extending in the row direction, plural bit lines BL extending in the column direction, and memory cells MC provided at the intersections of the word lines WL and the bit lines BL. The memory cell MC in the example of FIG. 4 has an anode connected to a bit line BL and a cathode connected to a word line WL. In a word, one bit line BL is connected to the anodes of plural memory cells MC in common, and one word line WL is connected to the cathodes of plural memory cells MC in common. In addition, each memory cell mat MM shares the bit lines BL or the word lines WL with memory cell mats MM adjacently located above and beneath.

For example, a memory cell mat MM1 shown in FIG. 4 includes bit lines BL00-BL02 extending in the column direction, word lines WL10-WL12 extending in the row direction, and memory cells MC provided at the intersections of the bit lines BL00-BL02 and the word lines WL10-WL12. In addition, it shares the bit lines BL00-BL02 with a memory cell mat MM0 adjacently located beneath, and shares the word lines WL00-WL02 with a memory cell mat MM2 adjacently located above.

Figure 5:
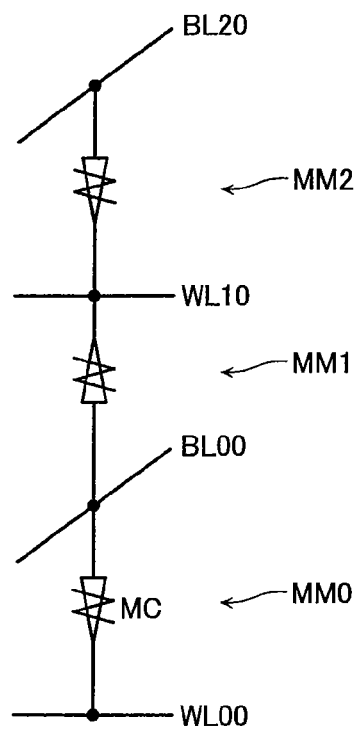
FIG. 5 is a diagram showing a structure of a memory cell group in the semiconductor memory device according to the embodiment.

Hereinafter, a group of bit lines BL arranged at the same position in the memory cell mats MM, such as the bit lines BL00 and BL20, is referred to as a "bit line group". Similarly, a group of word lines WL arranged at the same position in the memory cell mats MM, such as the word lines WL00 and WL10, is referred to as a "word line group". In addition, a group of memory cells MC arranged at the intersections of one bit line group and one word line group is referred to as a "memory cell group". In this case, a memory cell group, which locates at the intersections of a bit line group of bit lines BL00 and BL20 arranged at the same position in the row direction and a word line group of word lines WL00 and WL10 arranged at the same position in the column direction, is as shown in FIG. 5.

In addition, an access target of the memory cells MC is referred to as a "selected memory cell", other memory cells MC as "non-selected memory cells", a bit line BL connected to the selected memory cell MC as a "selected bit line", other bit lines BL as "non-selected bit lines", a word line WL connected to the selected memory cell MC as a "selected word line", and other word lines WL as "non-selected word lines".

Further, a voltage established on a bit line BL is represented by U, a voltage established on a selected bit line BL by Us, a voltage established on non-selected bit lines BL by Uu, a voltage established on a word line WL by W, a voltage established on a selected word line WL by Ws, and a voltage established on non-selected word lines WL by Wu.

FIG. 4 also shows a bias state of the memory cell array 1 in which the bit line BL00 is the selected bit line, the word line WL11 is the selected word line, and a memory cell MC110 in the memory cell mat MM1 connected to the selected bit line BL00 and the selected word line WL11 is the selected memory cell. In this case, the voltage Us is established on the selected bit line BL00 and the voltage Ws on the selected word line WL11 as can be found.

Figure 6:
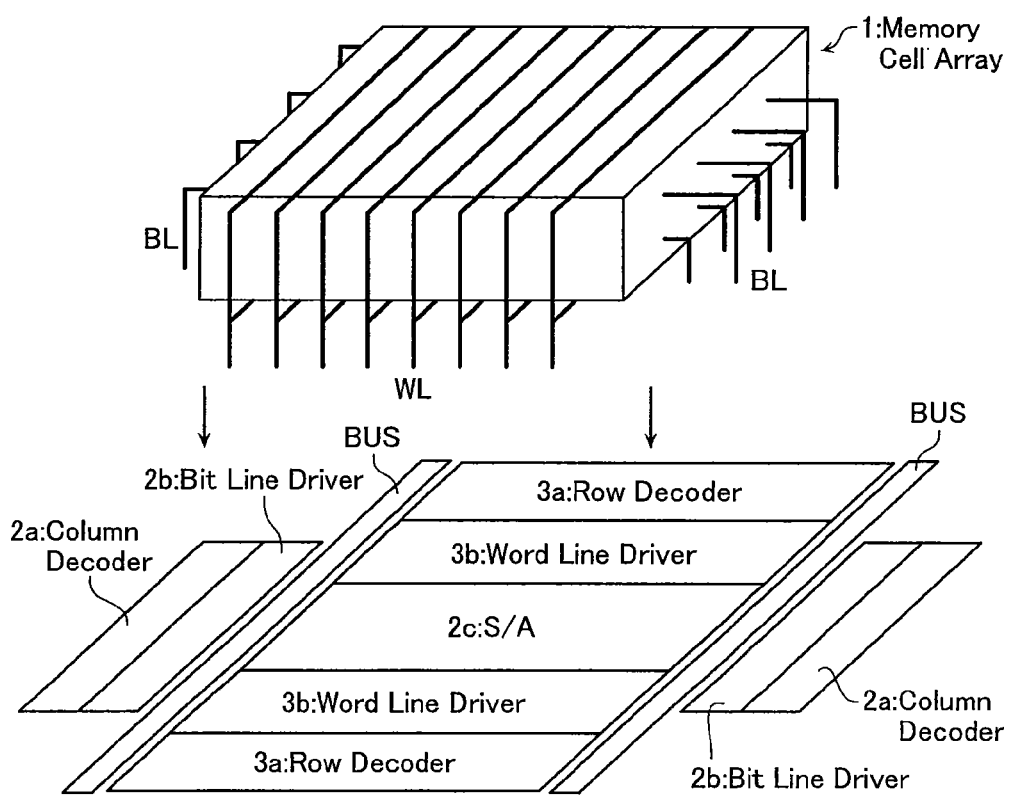
FIG. 6 is a structural diagram of the semiconductor memory device according to the embodiment.

In the case of the memory cell array 1 of the cross point type described above, peripheral circuits such as the column decoder 2a, the bit line driver 2b, the sense amplifier unit 2c, the row decoder 3a, the word line driver 3b, and the bus BUS can be formed on a silicon substrate immediately beneath the memory cell array 1 as shown in FIG. 6. This makes the chip area of the semiconductor memory device almost equal to the area of the memory cell array 1.

[Access Operation]

The following description is given to access operation in the semiconductor memory device according to the embodiment, particularly, in the case of the use of the memory cell MC in the weak reset state. For easy understanding, a memory cell mat MM of 3×3 memory cells MC is used for description.

In the embodiment, the selected bit line BL and the selected word line WL are supplied with fixed voltages and non-selected bit lines BL and non-selected word lines WL are brought into the floating state to make access to the memory cell MC. Hereinafter, this method of access operation is referred to as a "floating access method".

First, a description is given to the premise of description of access operation, that is, standby operation (hold operation).

Standby operation (hold operation) is operation before entering into access operation, and is operation of holding the state (data) of the memory cell MC.

Figure 7:
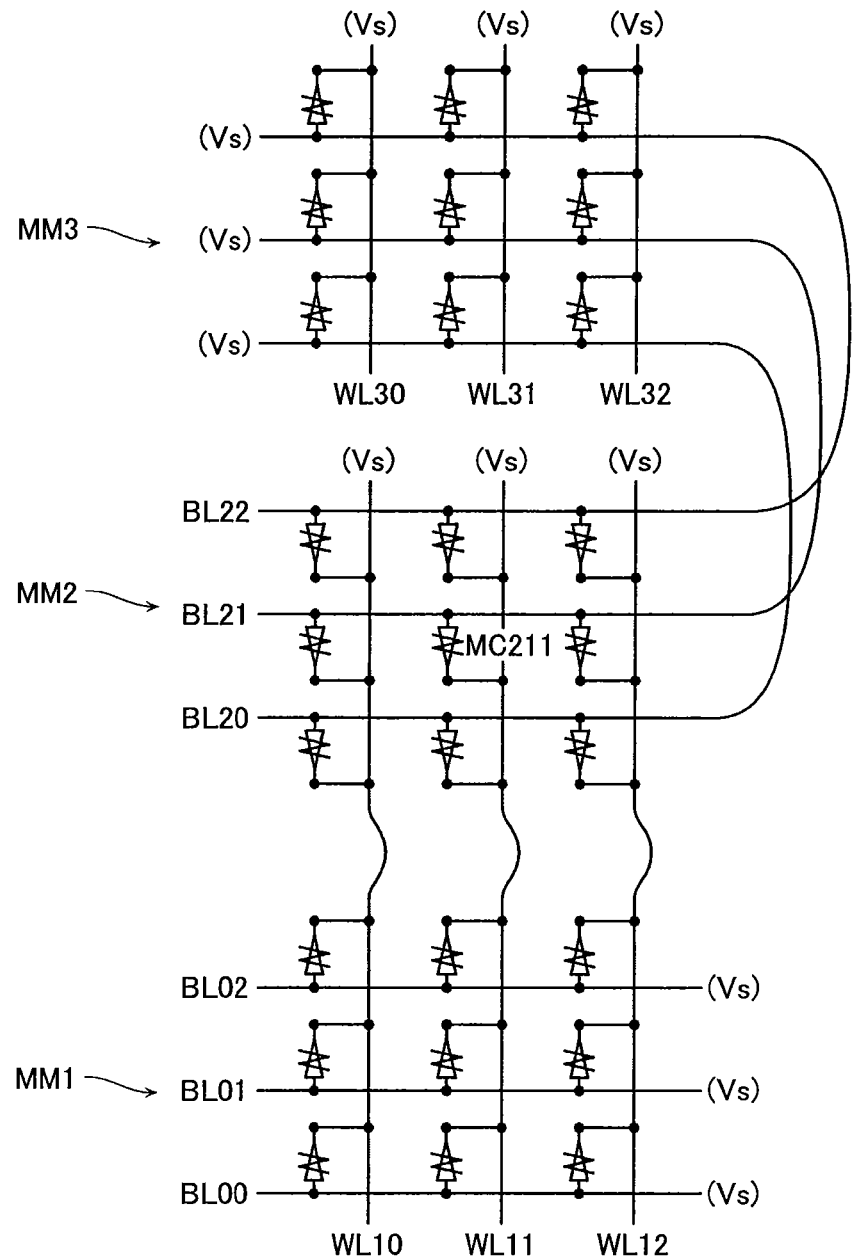
FIG. 7 is a diagram showing a bias state of the memory cell array in the semiconductor memory device according to the embodiment at the time of hold operation by a floating access method.

FIG. 7 is a diagram showing a bias state of the memory cell array 1 at the time of standby operation according to the embodiment.

In standby operation, the voltage U on all bit lines BL and the voltage WL on all word lines WL are set to the ground voltage Vss (reference voltage) or a voltage Vs close thereto. In this bias state, all memory cells MC in the memory cell array 1 cannot be biased. As a result, the states (data) of all memory cells MC can be held. The voltage Vs is an actually undefined voltage so that all bit lines BL and word lines WL are brought into the floating state if the memory cell array 1 is isolated from the power supply. If the memory cell array 1 is connected to the power supply, the voltage U on all bit lines BL and the voltage W on all word lines WL match the ground voltage Vss itself.

Next, a description is given to access operation in the floating access method. Access operation in the floating access method has an active standby phase and an access active phase.

At the start, the active standby phase is described.

The active standby phase is a process at a pre-stage before actually making access to a memory cell MC.

Figure 8:
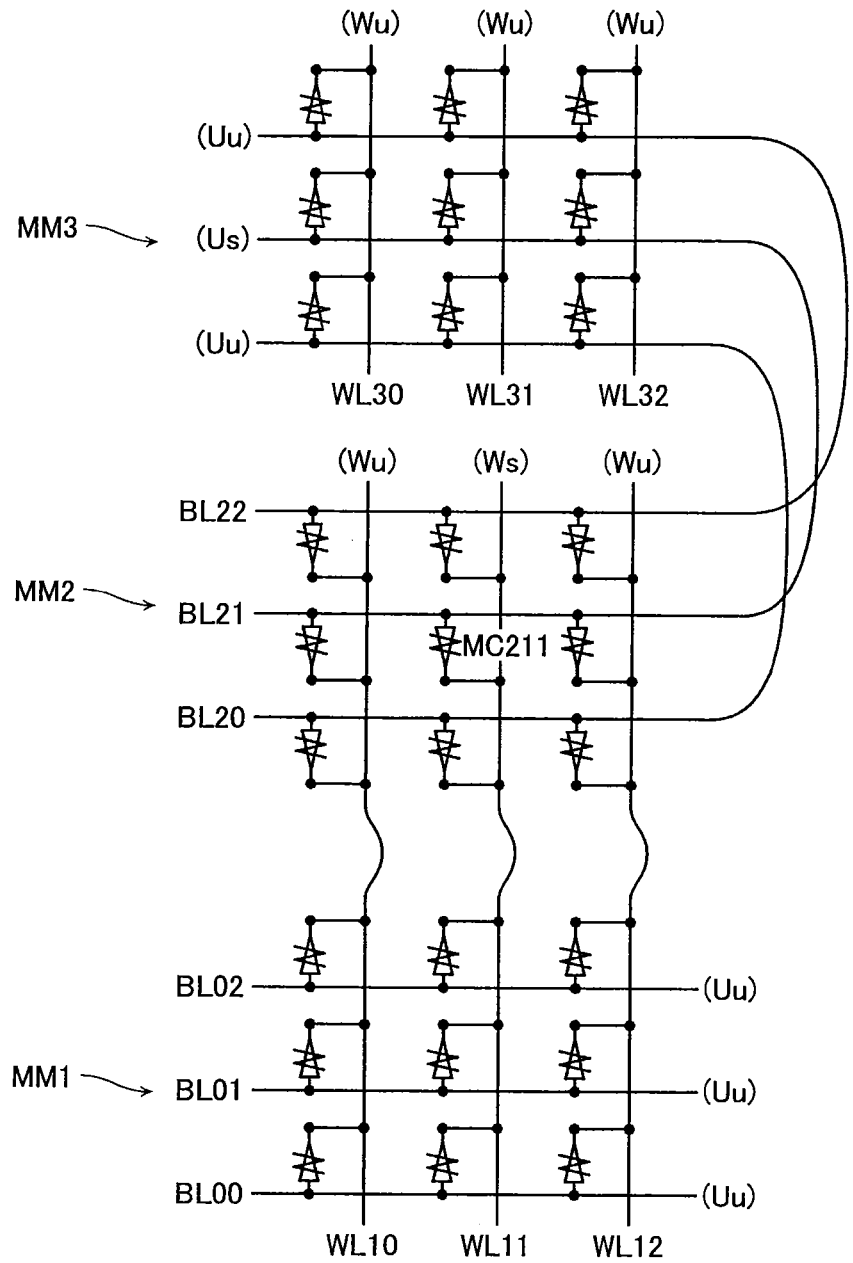
FIG. 8 is a diagram showing a bias state of the memory cell array in the semiconductor memory device according to the embodiment at the time of the active standby phase in access operation by the floating access method.

FIG. 8 is a diagram showing a bias state of the memory cell array 1 at the time of the active standby phase in access operation according to the embodiment.

In the figure, Vd denotes the set voltage Vset or the reset voltage Vreset, or a voltage close thereto. Δ denotes a voltage equal to or lower than ⅓ the reset voltage Vreset, which serves as a marginal voltage of the voltage on making a transition to the reset state or the set state. For example, the memory cell MC makes a transition to the reset state with the application of the reset voltage Vreset though it makes no transition to the reset state with the application of the voltage, Vreset−Δ.

In the active standby phase, all bit lines BL and word lines WL in the memory cell mat MM are supplied with fixed voltages though the voltages differ in accordance with read operation, reset operation and weak reset operation.

The memory cell array 1 has the same bias state at the time of the active standby phase in weak reset operation and in read operation. Namely, as shown in FIG. 8, a selected bit line BL21 and a selected word line WL11 are supplied with voltages Us=Ws=Vd/2 while other non-selected bit lines BL and non-selected word lines WL are supplied with voltages that establish a relation Wu≥Uu+2Δ.

At the time of the active standby phase in reset operation, the selected bit line BL and the selected word line WL are supplied with voltages that establish a relation Ws≥Us+2Δ while other non-selected bit lines BL and non-selected word lines WL are supplied with voltages Uu=Wu=Vd/2.

These voltage settings prevent the states of non-selected memory cells MC from making failed transitions even if capacitive coupling between adjacent bit lines or adjacent word lines is 100%.

An effective working of access operation by the floating access method requires that the voltage-current characteristic of a reverse-biased memory cell MC and the voltage-current characteristic of the memory cell MC in the reset state are almost the same independent of the state of the memory cell MC. For that reason, all memory cells MC in the memory cell array 1 before the access active phase are required to be in the reset state or the weak reset state. Therefore, writing to the weak reset state and so forth is executed in the following access active phase.

Subsequently, the access active phase is described.

The access active phase is a process of actually making access to a specific memory cell MC, that is, the selected memory cell MC.

Figure 9A:
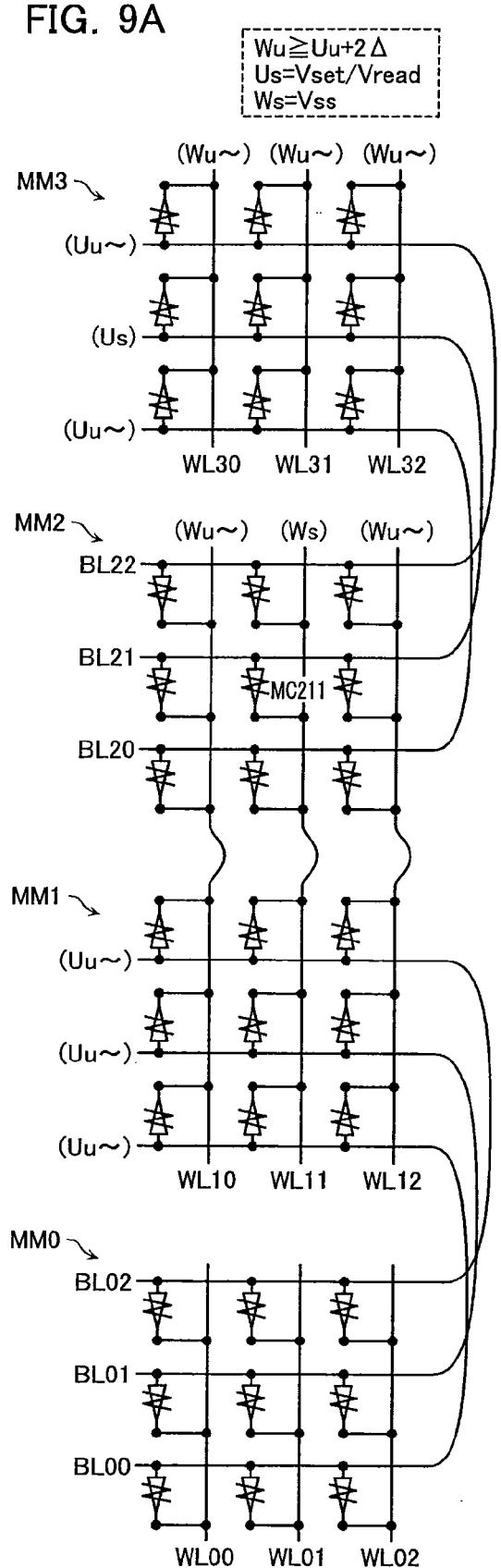
FIGS. 9A and 9B provide diagrams showing bias states of the memory cell array in the semiconductor memory device according to the embodiment at the time of the access active phase in access operation (weak reset operation or read operation) by the floating access method.
Figure 9B:
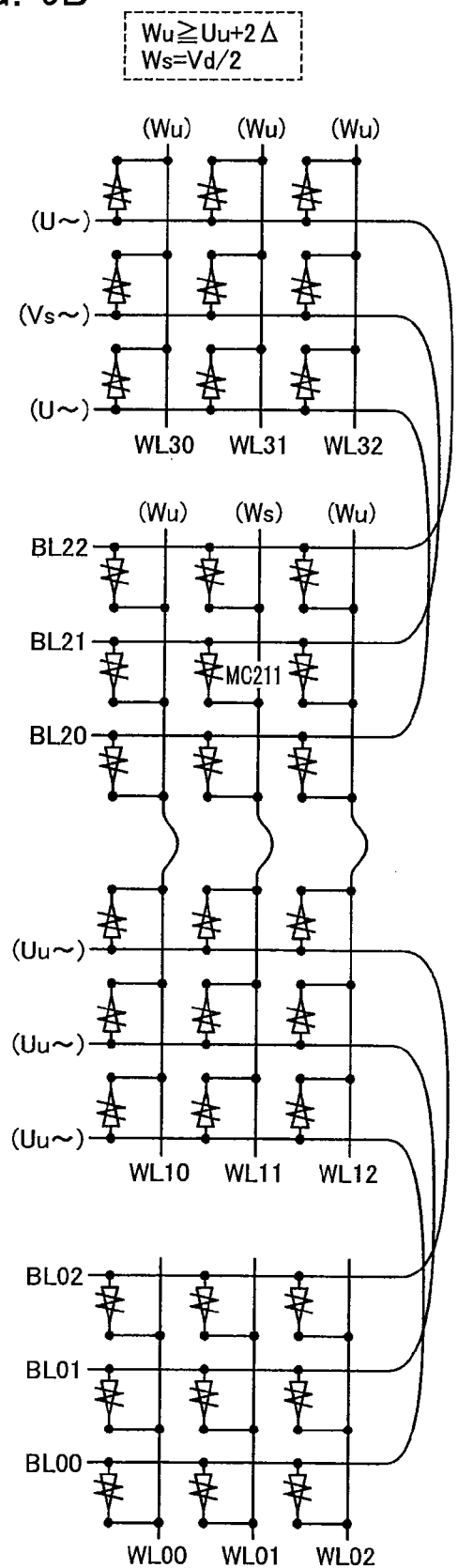

FIGS. 9A and 9B provide diagrams showing bias states of the memory cell array 1 at the time of the access active phase in access operation (weak reset operation and read operation) according to the embodiment. In the figure, "~" indicates that the bit line BL or the word line WL is in the floating state. For example, "Wu~" in the figure indicates that the word line WL supplied with the voltage Wu is brought into the floating state.

At the time of weak reset operation and read operation, the access active phase is further divided into a pre-access active phase shown in FIG. 9A and a post-access active phase shown in FIG. 9B.

In the pre-access active phase, the voltage settings at the memory cell array 1 differ in accordance with weak reset operation and read operation.

In the case of weak reset operation, as shown in FIG. 9A, non-selected bit lines BL and non-selected word lines WL set in the active standby phase are brought into the floating state (Uu~ and Wu~) while the selected bit line BL is supplied with the set voltage Us=Vset and the selected word line WL with the ground voltage Ws=Vss. As a result, independent of the state of the selected memory cell MC, the selected memory cell MC makes a transition to the set state. Subsequently, when the selected memory cell MC makes a transition to the set state, the later-described current limiter circuit provided at the selected bit line BL works to bring the selected bit line BL almost into the floating state. As a result, the voltage on the selected bit line BL is discharged to the ground voltage Vss. The working of the current limiter circuit makes it possible to detect the transition of the selected memory cell MC to the set operation. When the transitions of all selected memory cells MC to the set state are detected, the control shifts the processing to the post-active standby phase.

In the case of read operation, as shown in FIG. 9A, non-selected bit lines BL and non-selected word lines WL set in the active standby phase are brought into the floating state (Uu~ and Wu~). In addition, the selected bit line BL is supplied with the read voltage Us=Vread (at the time of read operation) and the selected word line WL with the ground voltage Ws=Vss. As a result, only the selected memory cell MC in the weak reset state makes a transition to the set state. In addition, when the selected memory cell MC makes a transition to the set state, the later-described current limiter circuit provided at the selected bit line BL works to bring the selected bit line BL almost into the floating state. As a result, the voltage on the selected bit line BL is discharged to the ground voltage Vss. The working of the current limiter circuit makes it possible to detect the transition of the selected memory cell MC to the set operation, similar to weak reset operation. Among those, the selected memory cell after making a transition to the set state in a certain time is determined as having been in the weak reset state, and other selected memory cells MC as having been in the reset state. Then, the control shifts the processing to the post-active standby phase.

In the post-access active phase, the voltage settings at the memory cell array 1 are the same in weak reset operation and read operation.

In the post-access active phase, as shown in FIG. 9B, all word lines WL are supplied with voltages in the active standby phase. Namely, a selected word line WL is supplied with a voltage Ws=Vd/2, and non-selected word lines WL with a voltage Wu≥Uu+2Δ. On the other hand, the bit line BL is kept in the floating state. In accordance with this voltage setting, the selected memory cell MC after making a transition to the set state is reverse-biased to make a transition to the weak reset state under the relation of the selected bit line BL supplied with the voltage Uu that falls near the ground voltage Vss due to the floating state and the selected word line WL supplied with Ws=Vd/2. Non-selected memory cells MC are biased in a direction that facilitates a transition to the weak reset state though the bias is not large enough to make a transition to the reset state and accordingly causes no problem about failed transitions of non-selected memory cells MC. In read operation, the memory cell MC in the reset state is not biased in such a manner that makes a transition to the set state. Accordingly, it causes no problem about failed transitions.

Figure 10:
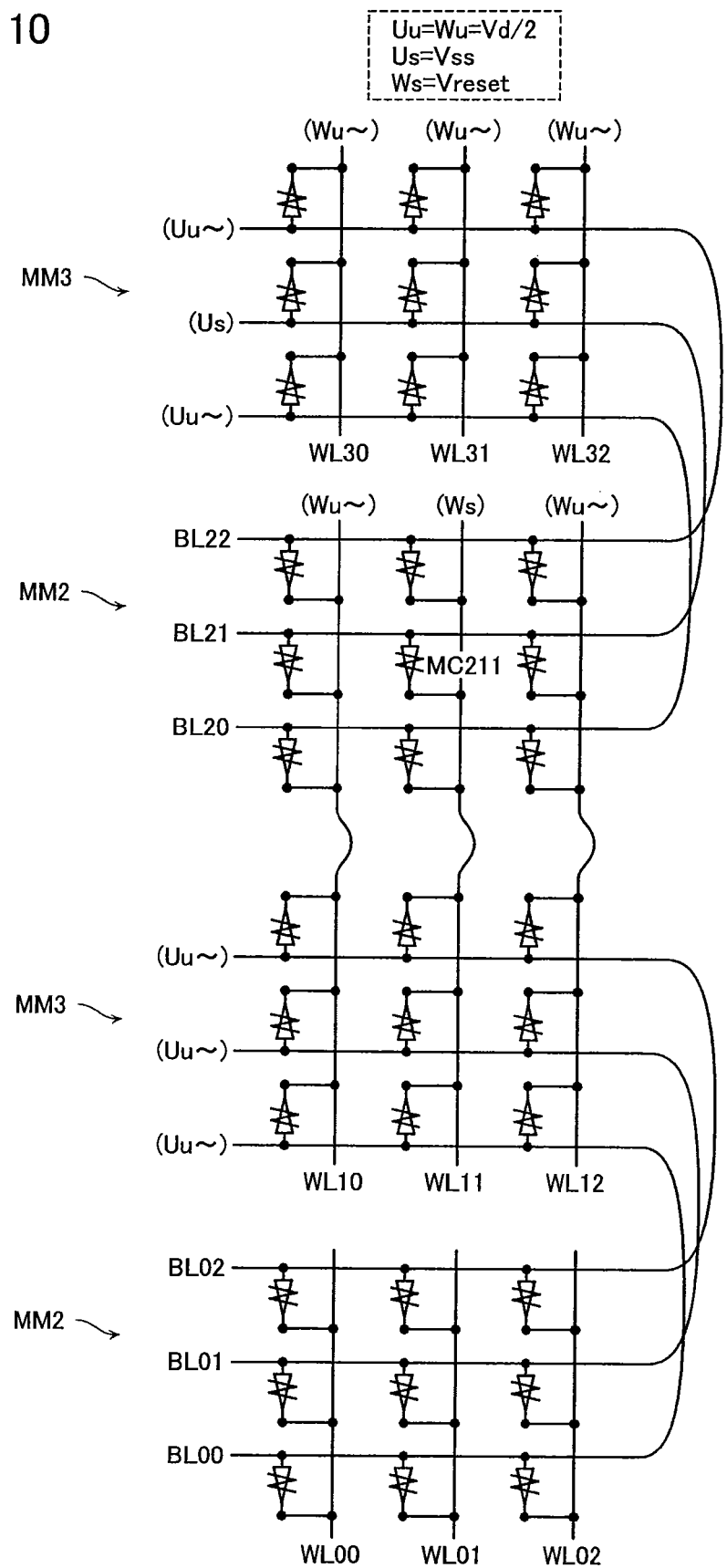
FIG. 10 is a diagram showing a bias state of the memory cell array in the semiconductor memory device according to the embodiment at the time of the access active phase in access operation (reset operation) by the floating access method.

FIG. 10 is a diagram showing a bias state of the memory cell array 1 at the time of the access active phase in access operation (reset operation) according to the embodiment.

In the case of reset operation, as shown in FIG. 10, non-selected bit lines BL and non-selected word lines WL once supplied with the voltages Uu=Wu=Vd/2 in the active standby phase are brought into the floating state. In addition, the selected bit line BL is supplied with the ground voltage Us=Vss and the selected word line WL with the reset voltage Ws=Vreset. As a result, the selected memory cell MC is reverse-biased with the reset voltage Vreset such that the selected memory cell makes a transition to the reset state independent of the current state.

[Access Circuit]

The following description is given to an access circuit according to the embodiment.

At the start, the sense amplifier unit 2c in the access circuit is described. The sense amplifier unit 2c can be used to realize the above-described weak reset operation or read operation.

Basically, the state of a memory cell MC is either the reset state or the weak reset state. In addition, read operation of changing a memory cell MC in the weak reset state to the set state is not greatly different from set operation. In read operation, however, it is important not to change a memory cell MC in the reset state to the set state. With this regard, the voltage established on a bit line BL differs in accordance with set operation and read operation. Specifically, the selected bit line BL in the case of set operation is supplied with the set voltage Us=Vset while the selected bit line BL in the case of read operation is supplied with the voltage Us=Vread. On the other hand, non-selected bit lines BL are brought into the floating state (Uu~) with the voltage Uu=Vset/2.

Figure 11:
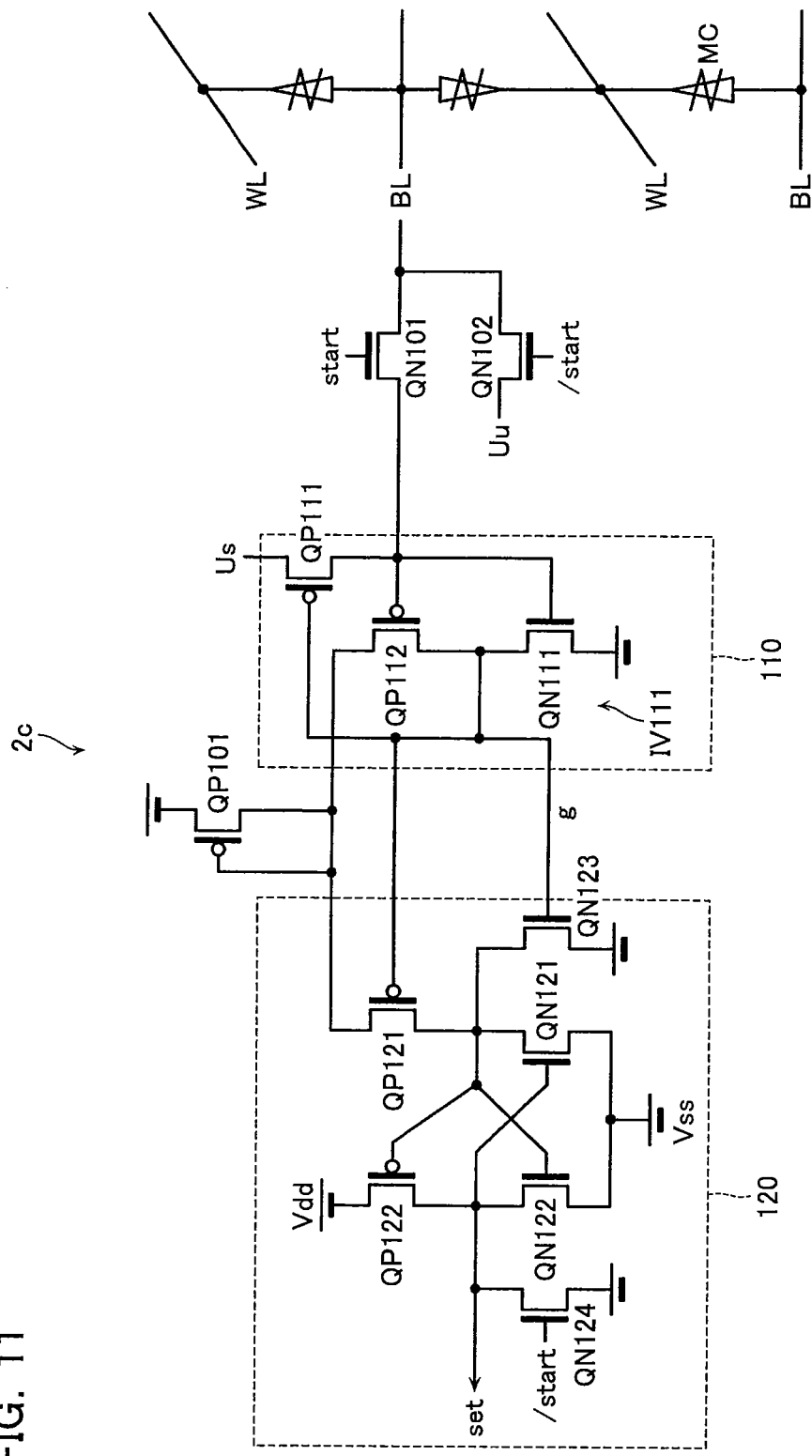
FIG. 11 is a circuit diagram of a sense amplifier unit in the semiconductor memory device according to the embodiment.

FIG. 11 is a circuit diagram of the sense amplifier unit 2c according to the embodiment.

The sense amplifier unit 2c includes a current limiter circuit 110 operative to limit the current flowing in the selected bit line BL, and a state detector circuit 120 operative to detect the state of the selected memory cell MC.

The bit line BL is connected to an NMOS-type transistor QN101 that electrically connects to the current limiter circuit 110, and an NMOS-type transistor QN102 that electrically connects to the terminal of the voltage Uu. The transistor QN101 is controlled by a control signal, start, and the transistor QN102 by a control signal, /start, opposite in logic to the control signal, start. Thus, during the control signal, start='L', the bit line BL is supplied with the voltage Uu. When the control signal, start='H', arises, the bit line BL is connected to the current limiter circuit 110.

The current limiter circuit 110 comprises a dynamic current mirror circuit. The current limiter circuit 110 includes a PMOS-type transistor QP111 provided between the terminal of the voltage Us and the bit line BL, and a PMOS-type transistor QP112 and an NMOS-type transistor QN111 that form an inverter IV111. The inverter IV111 has an input and an output, which are connected to the bit line BL and the gate of the transistor QP111, respectively. Hereinafter, the output of the inverter IV1 may also be referred to as a "node g".

When the memory cell MC makes a transition to the set state, the voltage on the bit line BL falls in accordance with the drop of the resistance of the memory cell MC. In this case, the voltage on the input of the inverter IV111 falls. Therefore, the output from the inverter IV111 rises in accordance therewith. As a result, the gate voltage on the transistor QP111 rises to limit the current flowing in the transistor QP111. In a word, the current limiter circuit 110 can be used to limit the current flowing in the bit line BL in accordance with the drop of the resistance of the memory cell MC and finally isolate the terminal of the voltage Us from the bit line BL.

The voltage Us established on the transistor QP111 greatly differs in accordance with weak reset operation and read operation. Therefore, for the purpose of securing the dynamic range, the inverter IV111 is driven with the current reduced by a constant-current-connected, PMOS-type transistor QP101.

The state detector circuit 120 is a circuit operative to detect and monitor the state of the memory cell MC, which provides the monitor result as an output signal, set. In the case of set operation, the output signal, set, is used as a signal indicative of set operation finish.

The state detector circuit 120 includes a PMOS-type transistor QP121 and an NMOS-type transistor QN121, which are serially connected between the transistor QP101 and the terminal of the ground voltage Vss, and a PMOS-type transistor QP122 and an NMOS-type transistor QN122, which form an inverter IV121 serially connected between the terminal of the power supply Vdd and the terminal of the ground voltage Vss. The transistor QP121 has a gate, which is connected to the node g. The transistor QN121 has a gate, which is connected to the connection node of the transistors QP122 and QN122. The transistors QP122 and QN122 have respective gates, both of which are connected to the connection node of the transistors QP121 and QN121. The state detector circuit 120 includes a transistor QN123 provided between the connection node of the transistors QP121 and QN121 and the terminal of the ground voltage Vss, and an NMOS-type transistor QN124 provided between the connection node of the transistors QP122 and QN122 and the terminal of the ground voltage Vss. The transistor QN123 has a gate, which is connected to the node g. The transistor QN124 is controlled by the control signal, /start. In the case of this configuration, the signal from the connection node of the transistors QP122 and QN122 turns to the output signal, set.

During the control signal, /start='H', the current limiter circuit 110 cannot work. At this time, the work of the transistor QN124 brings the output signal, set, into the initial state. As the resistance of the memory cell MC lowers to limit the current supplied to the bit line BL, the voltage on the node g rises to turn on the transistor QN123. This turns the input of the inverter IV121 to 'L', which causes the output signal, set='H'. This makes it possible to detect the transition of the state of the memory cell MC to the set state.

The access circuit according to the embodiment can make accesses to plural memory cells MC in a memory cell mat MM at the same time, utilizing the output signal, set, on making the accesses.

Specifically, in the case of set operation, it can be utilized as a signal indicating the transitions of all selected memory cells MC to the set state. The access circuit utilizes the output signals, set, respectively corresponding to all simultaneously accessed, selected memory cells MC to finish set operation at the time when the transitions of all selected memory cells MC to the set state are detected. Then, in order to change the selected memory cell MC to the weak reset state, the selected word line WL is supplied with a certain voltage.

In the case of read operation, the access circuit determines a memory cell MC as being in the weak reset state if the corresponding output signal, set, rises in a certain time, and a memory cell MC as being in the reset state if the corresponding output signal, set, does not rise, thereby reading data held in the memory cell MC.

Figure 12:
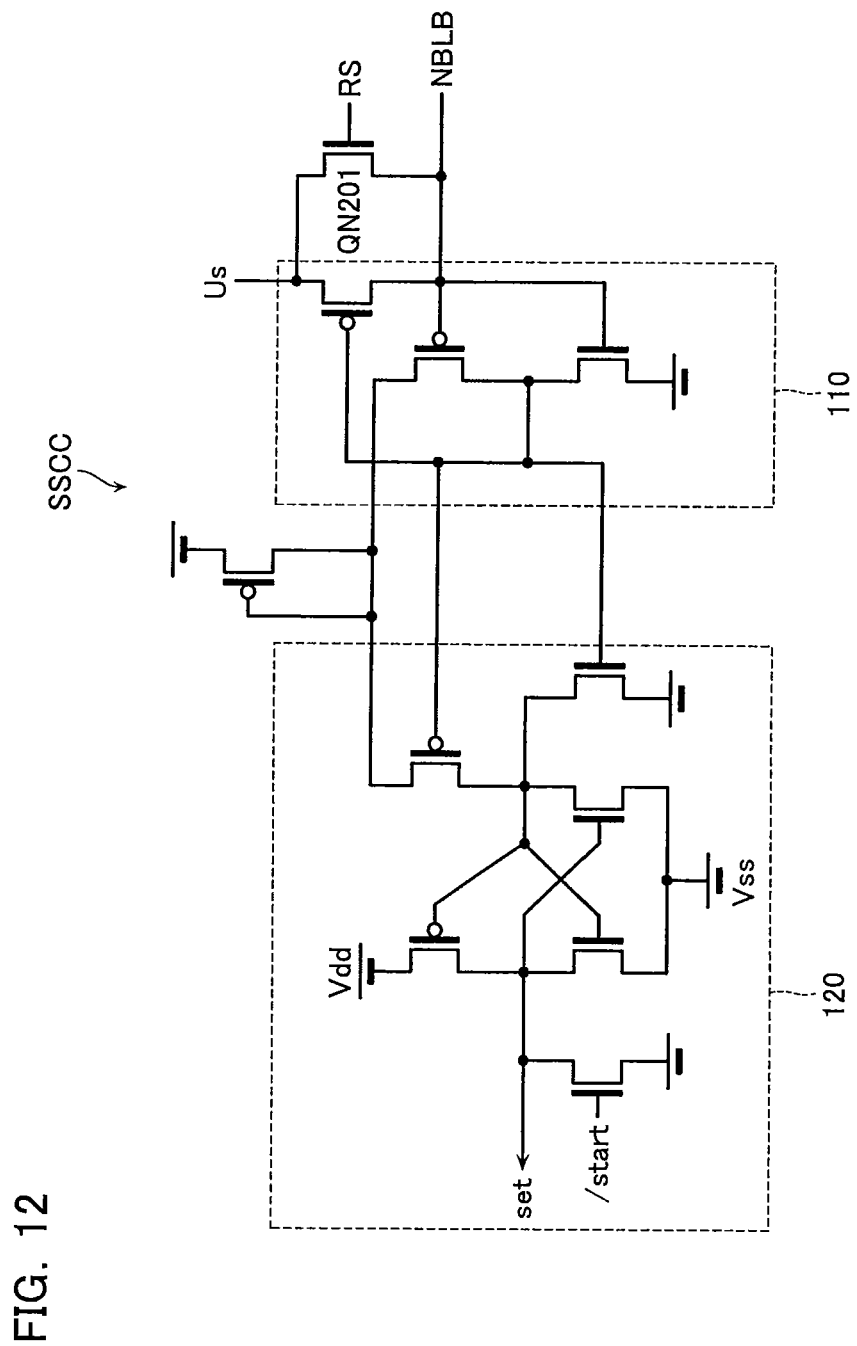
FIG. 12 is a circuit diagram of a sense amplifier unit in the semiconductor memory device according to the embodiment.

FIG. 12 is a circuit diagram of the sense amplifier unit 2c according to the embodiment. This circuit is a circuit including the configuration of the current limiter circuit 110 and the state detector circuit 120 shown in FIG. 11 in correspondence with a bit line block BLB. The bit line block BLB is a group of plural bit lines BL. The bit line block BLB is described later in detail. Hereinafter, the circuit may also be referred to as an "SSCC circuit block".

The SSCC circuit block includes the current limiter circuit 110 and the state detector circuit 120 shown in FIG. 11. The drain of the transistor QP111 in the current limiter circuit 110 is, however, connected to the node NBLB of the bit line block BLB. In addition, the SSCC circuit block includes, between the terminal of the voltage Us and the node NBLB, an NMOS-type transistor QN201 controlled by a control signal RS.

When plural bit line blocks BLB are selected at the same time, SSCC circuit blocks corresponding to the respective bit line blocks BLB work at the same time, thereby realizing simultaneous parallel accesses to the memory cells MC. This makes it possible to gain the data transfer rate at the time of write operation or read operation.

In reset operation, the signal RS='H' is given, and the selected bit line BL is supplied with the ground voltage Us=Vss, and the selected word line WL with the reset voltage Ws=Vreset to inactivate the SSCC circuit block. In this case, the output signal, set, is also fixed at 'H'.

Next, a description is given to the column decoder 2a and the row decoder 3a according to the embodiment.

Figure 13:
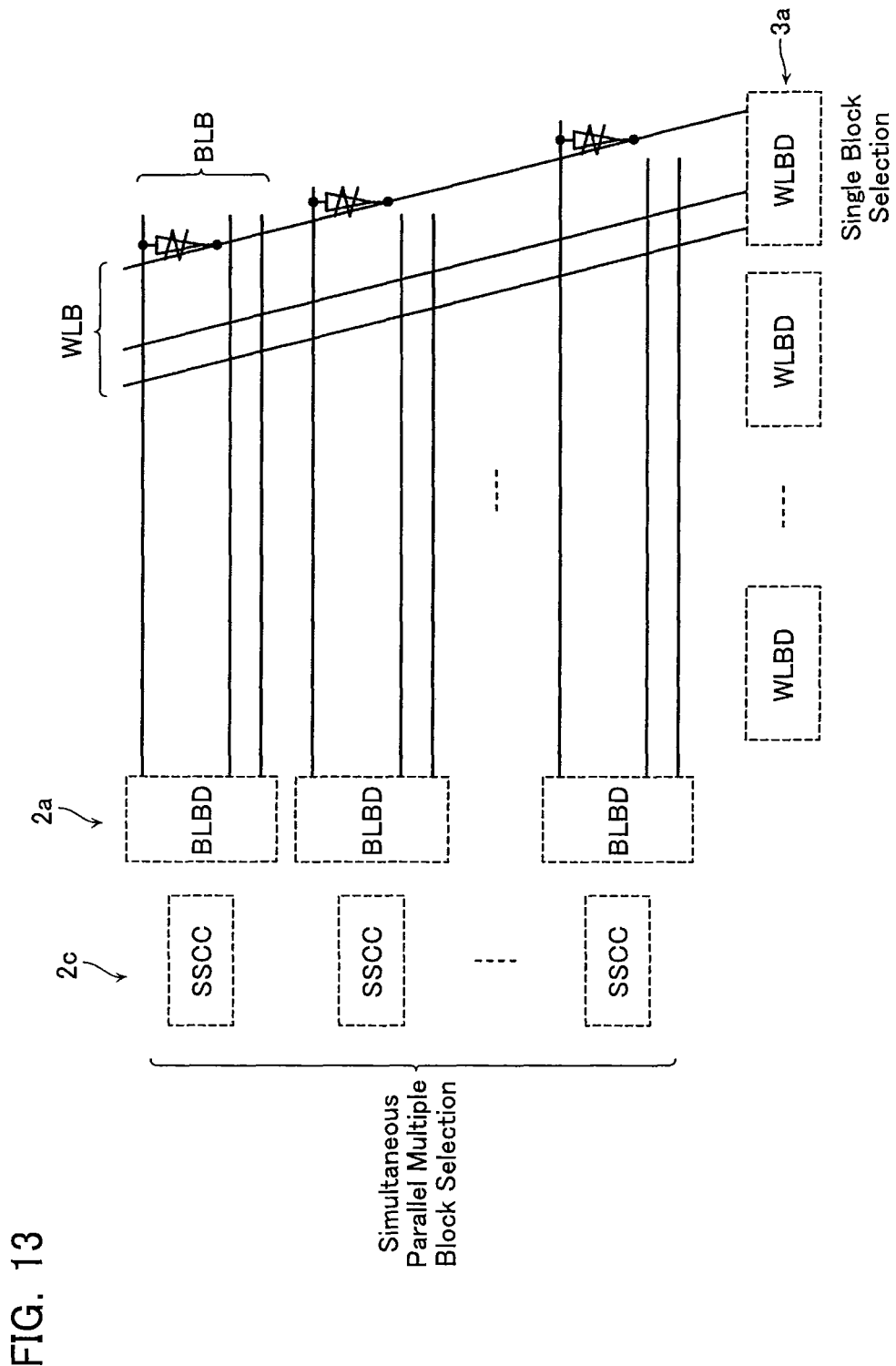
FIG. 13 is a diagram showing a structure of bit line blocks and word line blocks in the memory cell array in the semiconductor memory device according to the embodiment.

FIG. 13 is a diagram showing a configuration of the memory cell array 1 in addition to the sense amplifier unit 2c, the column decoder 2a and the row decoder 3a according to the embodiment.

In access operation according to the embodiment, only one word line WL and plural bit lines BL are selected in a memory cell mat MM, thereby realizing simultaneous accesses to plural memory cells MC.

The column decoder 2a includes plural bit line block inner decoders BLBD. The bit line block inner decoder BLBD is provided at each bit line block BLB. Each bit line block inner decoder BLBD selects one bit line BL from a bit line block BLB. In addition, each bit line block inner decoder BLBD is connected to the respective SSCC circuit block shown in FIG. 12.

The row decoder 3a includes plural word line block inner decoders WLBD. The word line block inner decoder WLBD is provided at each word line block WLB composed of plural word lines WL. Each word line block inner decoder WLBD selects one word line WL from a word line block WLB.

In making simultaneous accesses to plural memory cells MC, the access circuit applies plural bit line block inner decoders BLBD to select one bit line BL from every bit line block BLB. In addition, it applies one word line block inner decoder WLBD to select one word line from the word line block WLB corresponding to that word line block inner decoder WLBD. The selected bit lines BL and word line WL are supplied with voltages required for access operation from the bit line driver 2b and the word line driver 3b.

The following description is given to a configuration of the bit line block BLB and the bit line block inner decoder BLBD.

Figure 14:
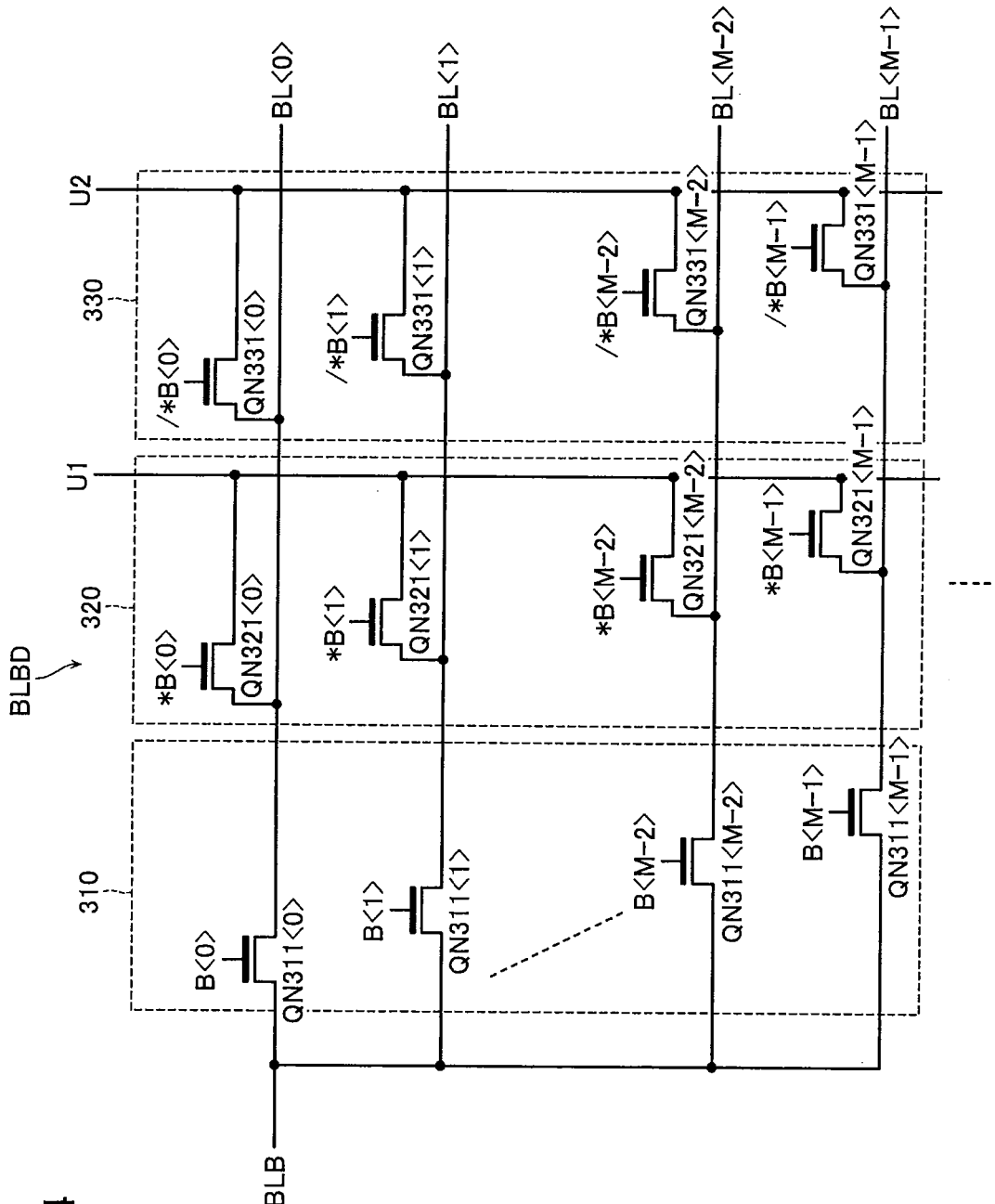
FIG. 14 is a circuit diagram of a bit line block inner driver in the semiconductor memory device according to the embodiment.
Figure 15:
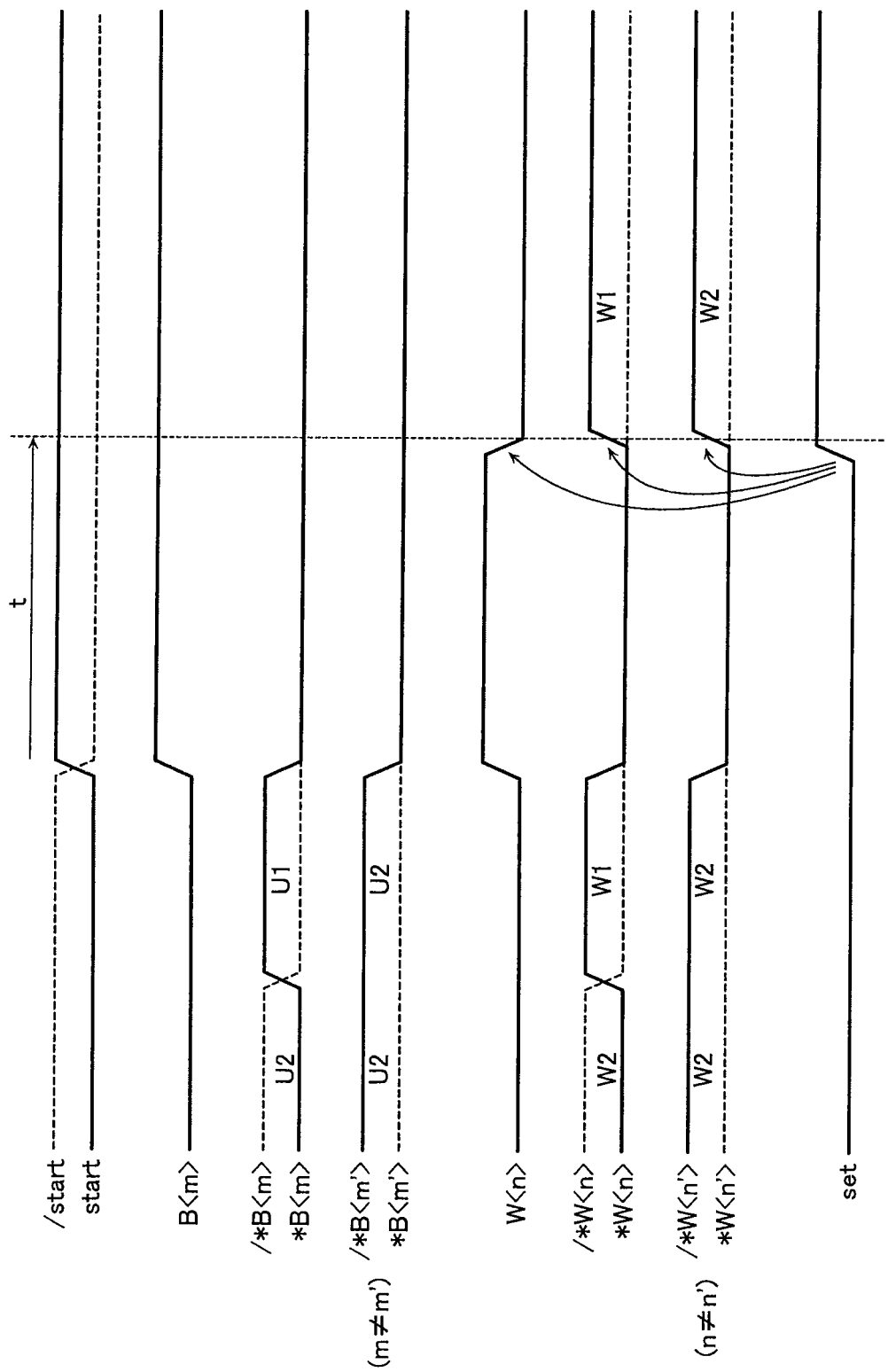
FIG. 15 is a timing chart on an access circuit in the semiconductor memory device according to the embodiment.

FIG. 14 is a circuit diagram of the bit line block inner decoder BLBD according to the embodiment. FIG. 15 is a timing chart on the SSCC circuit block, the bit line block inner decoder BLBD and the word line block inner decoder WLBD according to the embodiment.

Each bit line block BLB includes M bit lines BL<0> to BL<M−1>. These bit lines BL<0> to BL<M−1> are connected to a node NBLB in common via the later-described bit line selector unit 310.

The bit line block inner decoder BLBD includes a bit line selector unit 310 operative to connect any one of the bit lines BL<0> to BL<M−1> selectively with the node NBLB, and a selected bit line voltage unit 320 and a non-selected bit line voltage unit 330, which establish voltages on bit lines BL.

The bit line selector unit 310 includes NMOS-type transistors QN311<$m$> operative to connect the bit lines BL<$m$> (m=0 to M−1) with the node NBLB. The selected bit line voltage unit 320 includes NMOS-type transistors QN321<$m$> operative to connect the bit lines BL<$m$> with the terminal of the voltage U1. The non-selected bit line voltage unit 330 includes NMOS-type transistors QN331<m> operative to connect the bit lines BL<m> with the terminal of the voltage U2. The transistors QN311<m>, QN321<m> and QN331<m> are controlled by control signals B<m>, *B<m> and /*B<m>, respectively. The control signal /*B<m> is a signal opposite in logic to the control signal *B<m>.

The control signals B<0> to B<M−1> are signals supplied in common to all the bit line block inner decoders BLBD in the memory cell array 1, of which only one signal B<m> is turned to 'H' by a pre-stage decoder, not shown.

When the signal B<m> turns to 'H', the signal *B<m> turns to 'H' while other signals *B<m'> (m'=1 to M−1 and m' # m) turn to 'L'.

In this case, the selected bit line voltage unit 320 turns on the transistor QN321<m> that connects the selected bit line BL<m> with the terminal of the voltage U1.

Therefore, the selected bit line BL<m> is supplied with the voltage U1. When the control signal B<m> rises, however, the signal *B<m> turns to L'. Accordingly, the transistor QN321<m> turns off.

On the other hand, the non-selected bit line voltage unit 330 turns on the transistor QN331<m'> that connects the non-selected bit line BL<m'> with the terminal of the voltage U2. Therefore, the bit line BL<m'> is supplied with the voltage U2. When the control signal B<m> rises, however, the control signal /*B<m'> turns to 'L'. Accordingly, the transistor QN331<m'> turns off.

At the rear of the bit line block inner decoder BLED, a decoder is further provided for selecting a specific memory cell mat MM in the memory cell array 1. Operation of the above bit line block inner decoder BLED becomes effective only on the bit line block BLB in the memory cell mat MM selected by this decoder.

Next, a description is given to a configuration of the word line block WLB and the word line block inner decoder WLBD.

Figure 16:
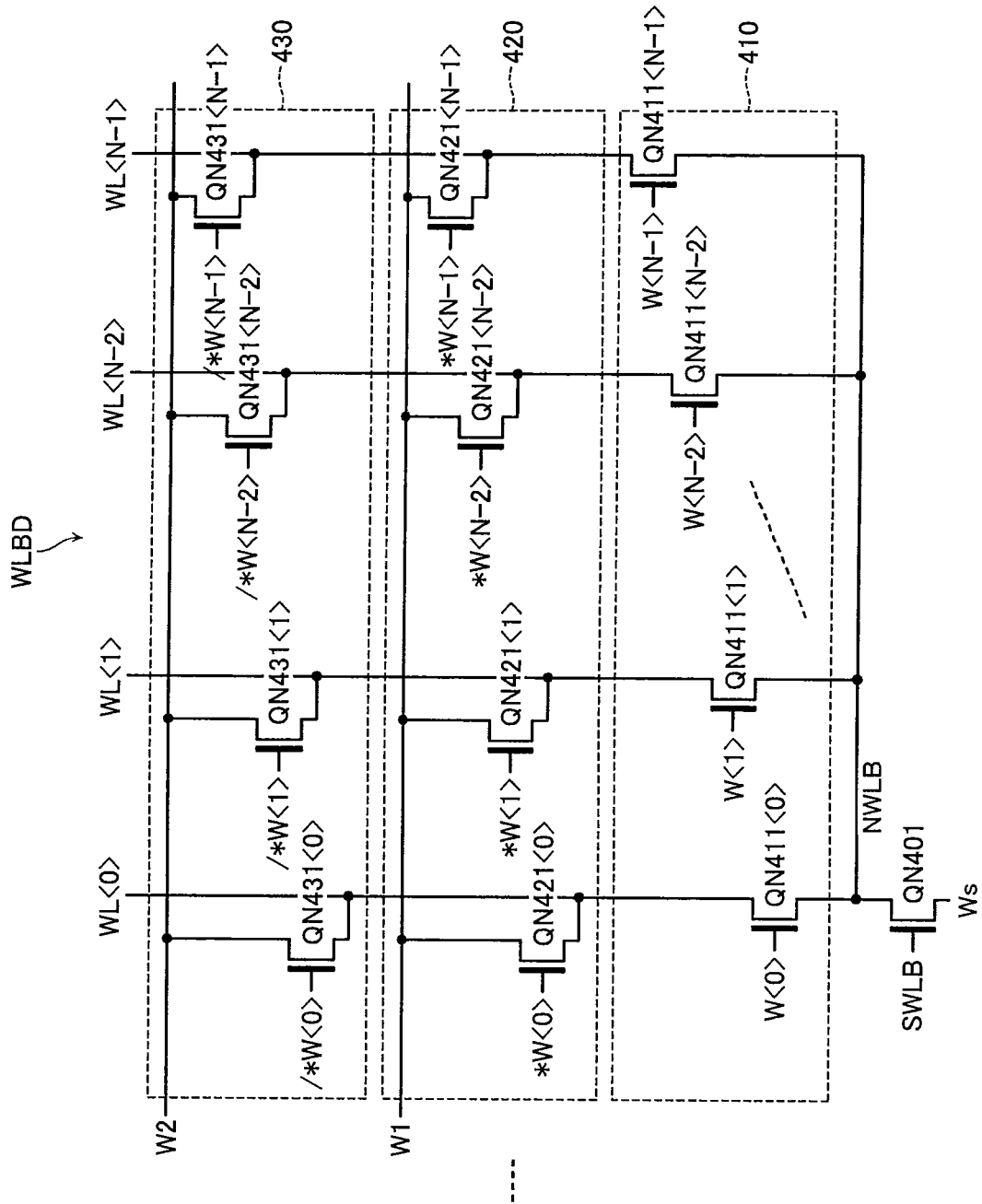
FIG. 16 is a circuit diagram of a word line block inner driver in the semiconductor memory device according to the embodiment.

FIG. 16 is a circuit block of the word line block inner decoder WLBD according to the embodiment.

Each word line block WLB includes N word lines WL<0> to WL<N−1>. These word lines WL0 to WLN−1 are connected to a node NWLB in common via the later-described word line selector unit 410. The node NWLB is connected to the terminal of the voltage Ws via an NMOS-type transistor QN401 controlled by a control signal SWLB.

The word line block inner decoder WLBD includes a word line selector unit 410 operative to connect any one of N word lines WL<0> to WL<N−1> selectively with the node NWLB, and a selected word line voltage unit 420 and a non-selected word line voltage unit 430, which establish voltages on word lines WL.

The word line selector unit 410 includes NMOS-type transistors QN411<n> operative to connect the word lines WLn (n=0 to N−1) with the node NWLB. The selected word line voltage unit 410 includes NMOS-type transistors QN421<n> operative to connect the word lines WL<n> with the terminal of the voltage W1. The non-selected word line voltage unit 430 includes NMOS-type transistors QN431<n> operative to connect the word lines WL<n> with the terminal of the voltage W2. The transistors QN411<n>, QN421<n> and QN431<n> are controlled by control signals W<n>, *W<n> and /*W<n>, respectively. The signal /*W<n> is a signal opposite in logic to the signal *W<n>.

The control signals W<n> to WL<N−1> are signals supplied in common to all the word line block inner decoders WLBD in the memory cell array 1, of which only one signal B<n> is turned to 'H' by a pre-stage decoder, not shown. Operation of the word line block inner decoder WLBD can act only on the selected word line block WLB in accordance with the action of the transistor QN401 controlled by the control signal SWLB.

When the control signal W<n>='H' arises, the signal *W<n>='H' arises while other signals *W<n'> (n'=1 to N−1 and n'≠n) turn to 'L'.

In this case, the selected word line voltage unit 420 turns on the transistor QN421<n> that connects the selected word line WL<n> with the terminal of the voltage W1. Therefore, the word line WL<n> is supplied with the voltage W1. When the control signal W<n> rises, however, the signal *W<n>='L' arises. Accordingly, the transistor QN421<n> turns off.

On the other hand, the non-selected word line voltage unit 430 turns on the transistor QN431<n'> that connects the non-selected word line WL<n'> with the terminal of the voltage W2. Therefore, the non-selected word line WL<n'> is supplied with the voltage W2. When the control signal W<n> rises, however, the control signal /*W<n'>='L' arises. Accordingly, the transistor QN431<n'> turns off.

Thereafter, in write operation, at the time when the state detector circuit 120 provides the output signal, set='H', indicating that the transition of the memory cell MC to the set state is detected (the arrow in FIG. 15), in the case of read operation, at the time when a certain time, t, elapsed after the control signal, start, rises, the control signal W<n>='L' arises.

At the rear of the word line block inner decoder WLBD, a decoder is further provided for selecting a specific memory cell mat MM in the memory cell array 1. Operation of the word line block inner decoder WLBD becomes effective only on the word line block WLB in the memory cell mat MM selected by this decoder.

As for the word line block inner decoders WLBD, only one is selected by the control signal SWLB as described above, different from the bit line block inner decoder BLBD, thereby preventing multiple selections of memory cells MC.

[State Changes of Memory Cell on Weak Reset Operation]

The following description is given to state changes of a memory cell at the time of weak reset operation.

Figure 17:
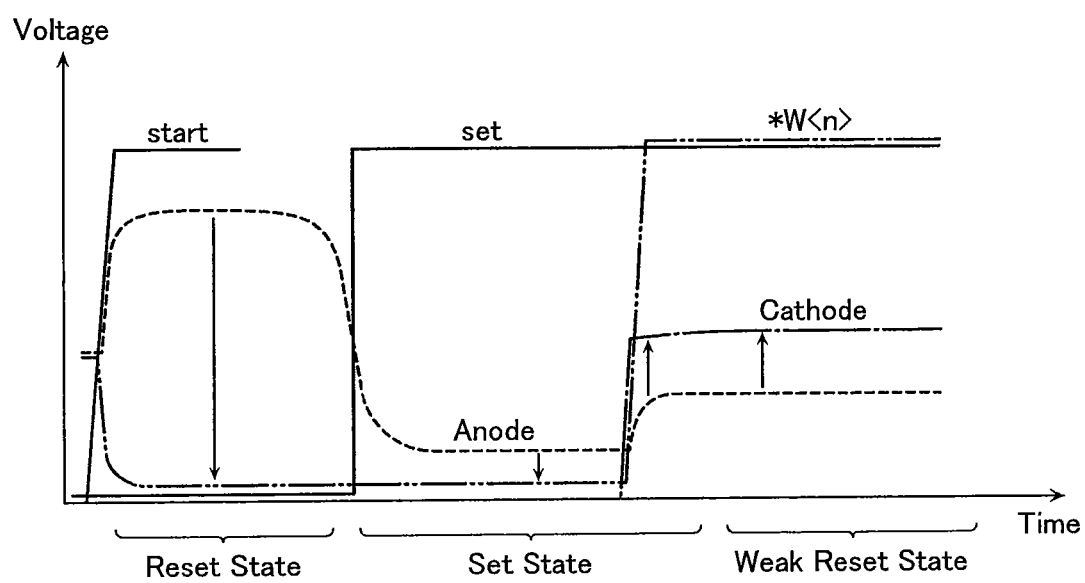
FIG. 17 is a diagram showing state changes of the memory cell in the semiconductor memory device according to the embodiment at the time of weak reset operation by the floating access method.

FIG. 17 is a diagram showing state changes of a memory cell at the time of weak reset operation according to the embodiment. This figure shows an instance when a memory cell MC in the reset state is changed via the set state to the weak reset state. The arrows in the figure indicate the potential differences between the anode and the cathode of the memory cell MC.

Before access operation, the selected bit line BL and the selected word line WL are supplied with a common middle voltage, Vd/2. When the control signal, start, rises from 'L' to 'H', the access active phase in weak reset operation begins such that the selected bit line BL is supplied with the set voltage Vset and the selected word line WL with the ground voltage Vss. As a result, the anode of the memory cell MC is supplied with almost the voltage Vset, and the cathode of the memory cell MC with almost the ground voltage Vss.

At this point in time, the set voltage Vset is applied across the memory cell MC in the reset state almost as it is such that no large cell current flows therein. Therefore, the current limitation by the current limiter circuit 110 does not work. As a result, the output signal, set, from the state detector circuit 120 is at 'L'.

Thereafter, this voltage setting causes the memory cell MC to make a transition from the reset state to the set state. As a result, the memory cell MC exhibits a lower resistance, and accordingly the cell current increases rapidly. In accordance therewith, the voltage on the bit line BL falls. Therefore, the current limiter circuit 110 works to limit the current flowing in the bit line BL and isolate the bit line BL from the power supply in the end. On receipt of the variation in voltage on the bit line BL, the output signal, set, from the state detector circuit 120 rises from 'L' to 'H'. At this point in time, the potential difference between the anode and the cathode of the memory cell MC becomes very small.

Although the characteristics of state transitions of simultaneously accessed memory cells MC differ, when the transitions of all memory cells MC to the set state are detected as the output signals, set, corresponding to all memory cells MC rise, the word lines WL are isolated from the ground voltage Vss to elevate *W<n> and *W<n'> again. Then, the control shifts the processing to the post-access active phase.

In the post-access active phase, the word lines WL are supplied with the voltage at the time of the active standby phase. In a word, the selected word line WL is supplied with the voltage Vd/2. For the purpose of strongly making a transition to the weak reset state, the selected word line WL may be supplied with a much higher voltage than the voltage Vd/2. On the other hand, the bit lines BL are retained in the floating state.

The cell current flowing in the memory cell MC in the set state has almost the same rise timing either if reverse-biased or if forward-biased. Therefore, the voltage on the anode of the memory cell MC rises as it is charged from the word line WL though it is always lower than the voltage on the word line WL so that the memory cell MC is always reverse-biased. As a result, the memory cell MC in the set state makes a transition to the weak reset state. Once the memory cell MC makes the transition to the weak reset state, the reverse characteristic of the memory cell MC becomes almost the same as that in the reset state. Therefore, the current flowing from the cathode into the anode in the memory cell MC almost disappears.

The voltage on the word lines WL is established again. Accordingly, non-selected memory cells MC are reverse-biased to enhance the weak reset state. Therefore, even if non-selected memory cells MC are reverse-biased, it is effectively possible to prevent a large cell current flowing in non-selected memory cells MC as that in a failed memory cell in the butterfly state. This makes it possible to bring all memory cells MC in the memory cell array 1 always into the reset state or the weak reset state.

CONCLUSION

As described above, the memory cells used in the semiconductor memory device according to the embodiment have the reset state that cannot be changed to a lower resistance without the application of a larger voltage, and the weak reset state that can be changed to a lower resistance with the application of even a smaller voltage. In these states, the memory cells each have a higher resistance and accordingly they are suitable for access operation by the floating access method as can be said. This makes it possible to suppress the power consumption in the semiconductor memory device.

The memory cells according to the embodiment can be used to configure a memory cell array of the cross-point type. This makes it possible to realize a large-capacity memory cell array having a three-dimensional structure.

Further, in the case of access operation according to the embodiment, the history via the set state is utilized in write operation. In read operation, after determining if it is in the reset state or the weak reset state in accordance with the difference in easiness of the transition to the set state, it is written back to the high resistance again. This makes it possible to provide a semiconductor memory device capable of nonvolatilely storing data in accordance with the history of applied voltages on a memory cell in a sense.

In a word, according to the embodiment, it is made possible to provide a semiconductor memory device capable of achieving lower power consumption and a larger capacity while utilizing the history of applied voltages on the memory cell.

OTHERS

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array including a memory cell layer, said memory cell layer containing plural first lines, plural second lines intersecting said first lines, and plural memory cells provided at intersections of said plural first lines and second lines; and
   an access circuit operative to make access to said memory cells via said first lines and said second lines, wherein,
   when applying a voltage of a first polarity lower than a read voltage and a voltage of a second polarity different from said first polarity to said memory cell storing a first data and said memory cell storing a second data different from said first data, a cell current flowing in said memory cell is substantiality the same, and
   said access circuit, on making access to said memory cell, applies said read voltage of said first polarity to said memory cell, monitors said cell current, and
   determines a stored data of said memory cell based on said cell current.

2. The semiconductor memory device according to claim 1, wherein
   said memory cell has at least two resistance states of a high-resistance state and a low-resistance state, and stores said first data and said second data at said high-resistance state.

3. The semiconductor memory device according to claim 2, wherein
   said access circuit, on making access to said memory cell, detects a transition of said resistance state by monitoring said cell current.

4. The semiconductor memory device according to claim 3, wherein
   said access circuit, on making access to said memory cell, applies said read voltage to said memory cell, and determines that said stored data of said memory cell is said first data when said resistance state of said memory cell transits to said low-resistance state from said high-resistance state.

5. The semiconductor memory device according to claim 3, wherein
   said access circuit, on making access to said memory cell, applies said read voltage to said memory cell, and determines that said stored data of said memory cell is said second data when said resistance state of said memory cell does not transit.

6. The semiconductor memory device according to claim 2, wherein
   said access circuit, on making access to said memory cell, writes back to said high-resistance state of said memory cell after determining said stored data of said memory cell.

7. The semiconductor memory device according to claim 1, wherein
   an access target of said memory cells is defined as a selected memory cell, said first line connected to said selected memory cell as a selected first line, and said second line connected to said selected memory cell as a selected second line,
   said access circuit, on making access to said selected memory cell, brings at least one of said first lines and said second lines connected to said non-selected memory cells into a floating state.

* * * * *